(12) United States Patent
Amonett (10) Patent No.: US 11,482,841 B2
(45) Date of Patent: Oct. 25, 2022

(54) MULTI-ORIENTATION POWER SUPPLY ENCLOSURE

(71) Applicant: Scott Fetzer SFEG, Fairview, TN (US)

(72) Inventor: Daniel K. Amonett, Murfeesboro, TN (US)

(73) Assignee: SCOTT FETZER SFEG, Fairview, TN (US)

( * ) Notice: Subject to any disclaimer, the term of this patent is extended or adjusted under 35 U.S.C. 154(b) by 375 days.

(21) Appl. No.: 16/864,916

(22) Filed: May 1, 2020

(65) Prior Publication Data

US 2021/0344176 A1    Nov. 4, 2021

(51) Int. Cl.
| | | |
|---|---|---|
| *H02G 3/08* | (2006.01) | |
| *H02B 1/28* | (2006.01) | |
| *H02B 1/30* | (2006.01) | |
| *F21Y 115/10* | (2016.01) | |
| *F21V 23/00* | (2015.01) | |

(52) U.S. Cl.
CPC ............. *H02B 1/28* (2013.01); *H02B 1/305* (2013.01); *F21V 23/007* (2013.01); *F21Y 2115/10* (2016.08)

(58) Field of Classification Search
CPC .......... H02G 3/08; H02G 3/081; H02G 3/085; H02G 3/086; H02G 3/088; H02G 3/14; H02B 1/28; H02B 1/305; H02B 1/30; H02B 1/46; H02B 1/48; F21Y 2115/10; H01R 13/46; H01R 13/502; H01R 13/52; H01R 13/53; F21V 23/007

USPC ........... 174/50, 520, 535, 559, 560, 561, 53; 220/3.2–3.9, 4.02; 439/535, 536, 538; 361/600, 601, 641, 659, 679.01
See application file for complete search history.

(56) References Cited

U.S. PATENT DOCUMENTS

| | | | | |
|---|---|---|---|---|
| 3,927,785 A | * | 12/1975 | Kinney | H02G 3/086 174/53 |
| 6,179,144 B1 | * | 1/2001 | Abroy | H02B 1/28 220/3.8 |
| 6,279,768 B1 | * | 8/2001 | Mendoza | H02G 3/10 220/3.94 |
| 6,392,141 B1 | * | 5/2002 | Smith | H02B 1/202 174/499 |
| 6,979,779 B2 | * | 12/2005 | Grady | H02G 3/126 174/50 |

(Continued)

*Primary Examiner* — Angel R Estrada
(74) *Attorney, Agent, or Firm* — Emerson, Thomson & Bennett; Roger D. Emerson (57) ABSTRACT

Provided in this disclosure is a reversible power supply enclosure. A base component defines a body of the power supply enclosure. The base component includes a base surface and side surfaces formed along opposing edges of the base surface. An offset flange is formed along the base surface. A closed end component is connected to the base component and includes a second offset flange. The offset flanges displace the base component the predetermined distance from the mounting surface. A cover component includes a primary surface and a perpendicular secondary surface for enclosing the base component. A lip portion substantially surrounds the peripheries of the primary and secondary surfaces, thereby enabling the power supply enclosure to be reversibly mounted in either a vertical orientation or a horizontal orientation such that both orientations provide a moisture-resistant power supply enclosure.

12 Claims, 9 Drawing Sheets

(56) References Cited

U.S. PATENT DOCUMENTS

| | | | | |
|---|---|---|---|---|
| 8,570,716 B2* | 10/2013 | Ward | ............... | H02B 1/03 |
| | | | | 174/50 |
| 8,599,540 B2* | 12/2013 | Fernandez | ............. | H05K 7/186 |
| | | | | 174/547 |
| 8,901,417 B2* | 12/2014 | Herring | ............... | H05K 5/0008 |
| | | | | 174/547 |
| 9,035,175 B2* | 5/2015 | Korcz | ............... | H02G 3/12 |
| | | | | 174/50 |
| 10,888,007 B1* | 1/2021 | Bahl | ............... | H02G 3/081 |

* cited by examiner

MULTI-ORIENTATION POWER SUPPLY ENCLOSURE

I. BACKGROUND

A. Technical Field

The present invention pertains to the field of enclosures for LED power supplies. The present invention pertains particularly to the field of multi-purpose enclosures for LED power supplies that can be mounted in a variety of positions and in a variety of different moisture conditions.

B. Description of Related Art

Household and commercial lighting using LED (light emitting diode) sources has become commonplace in recent years. However, LED sources have specific power requirements that are different from traditional incandescent and fluorescent lighting sources. Since LEDs are low energy consumption devices with a long lifespan, LEDs require specialized power supplies.

LED lighting requires an LED power supply that regulates the power required for an individual LED or an array of LEDs, similar in principle to a ballast for a fluorescent lamp or a transformer for low-voltage bulbs. LEDs are designed to run on low voltage (12-24V), direct current (DC) electricity. However, standard utility supply is higher voltage (110V), alternating current (AC). Thus, LEDs have different power requirements that require specialized power supply enclosures. Specifications for such power supply enclosures, as used in various operating conditions such as wet/damp conditions, are established by Underwriters Laboratories (UL).

For an LED power supply to be used in a wet/damp location, UL requires that the power supply be mounted in a power supply enclosure that is raised a minimum of one-half inch above the mounting surface, which can be a roof or floor or other suitable flat, horizontal surface. As currently performed with existing components, power supply enclosures are typically raised ½ inch above the mounting surface by the installer by placing a stack of nuts and/or washers under the power supply enclosure. Alternatively, an installer can purchase or fabricate a type of bracket which will raise the power supply the required distance. Such improvised solutions are needlessly time consuming and inefficient.

Such LED power supply enclosures are generally rectangular, having a long dimension and a short dimension. Depending on space requirements for a particular location, it can be desirable to mount a power supply enclosure vertically (where the long dimension is oriented in the vertical direction), or horizontally (where the long dimension is oriented in the horizontal direction). It is also desirable to have an enclosure that can be mounted either vertically or horizontally with both orientations meeting the wet/damp requirements. However, currently existing products are designed to be either vertically mounted or horizontally mounted, not both.

The UL 48 standard has recently been updated to require that a high voltage area of the enclosure be isolated from a low voltage area where common wiring connections are made. However, currently existing commercial products are not available that provide such isolation.

II. SUMMARY

Provided in this disclosure is a reversible power supply enclosure. A base component defines a body of the power supply enclosure. The base component includes a base surface having a plurality of edges. A first side surface is formed along a first edge of the base surface and a second side surface is formed along a second edge of the base surface. A first offset flange is formed along a third edge of the base surface for displacing the base component a predetermined distance from a mounting surface.

The reversible power supply enclosure further includes a closed end component connected to the base component along a fourth edge of the base surface. The closed end component includes a second offset flange for displacing the base component the predetermined distance from the mounting surface. A conduit cover is connected to the base component at a position substantially proximate to the first offset flange. The conduit cover includes a plurality of openings for attaching a conduit, a ground bolt, and/or a switch. A partition is optionally, selectively connected to the base component at a position interior to the conduit cover. The partition defines an isolated area for high voltage wiring within the base component.

A cover component is provided which includes a primary surface for enclosing an opening between the first and second side surfaces and the closed end component. A secondary surface, perpendicular to the primary surface, is provided for enclosing the closed end component. A lip portion substantially surrounds the peripheries of the primary and secondary surfaces, thereby enabling the power supply enclosure to be reversibly mounted in either a vertical orientation or a horizontal orientation such that both orientations provide a moisture-resistant power supply enclosure.

According to one aspect of the invention, a power supply enclosure is provided that can be mounted in a wet/damp location in compliance with UL requirements.

According to another aspect of the invention, a power supply enclosure is provided that can be mounted in a wet/damp location at the required distance without fabricating a part or employing other improvised solutions.

According to yet another aspect of the invention, a power supply enclosure is provided that can be reversibly mounted between vertical and horizontal orientations.

According to a further aspect of the invention, a power supply enclosure that provides isolation between a high voltage area of the enclosure and a low voltage area where common wiring connections are made.

Other benefits and advantages of this invention will become apparent to those skilled in the art to which it pertains upon reading and understanding of the following detailed specification.

III. BRIEF DESCRIPTION OF THE DRAWINGS

The disclosed power supply enclosure may take physical form in certain parts and arrangement of parts, embodiments of which will be described in detail in this specification and illustrated in the accompanying drawings which form a part hereof and wherein.

IV. DETAILED DESCRIPTION

Reference is now made to the drawings wherein the showings are for purposes of illustrating embodiments of the article only and not for purposes of limiting the same, and wherein like reference numerals are understood to refer to like components. The respective top, side, and edge views depicted in FIGS. 1A, 1B, and 1C and the exploded view of FIG. 2 depict a reversible power supply enclosure 100 in accordance with an exemplary embodiment of the present invention.

Figure 1A:
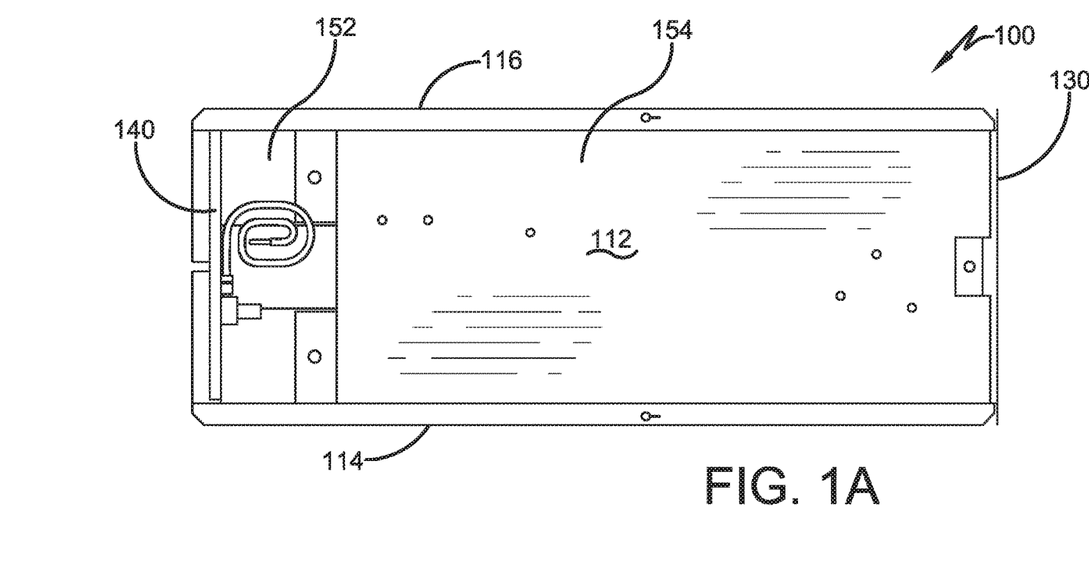
FIGS. 1A, 1B, and 1C are respective top, side, and edge views of a power supply enclosure in accordance with an exemplary embodiment of the present invention.
Figure 1B:
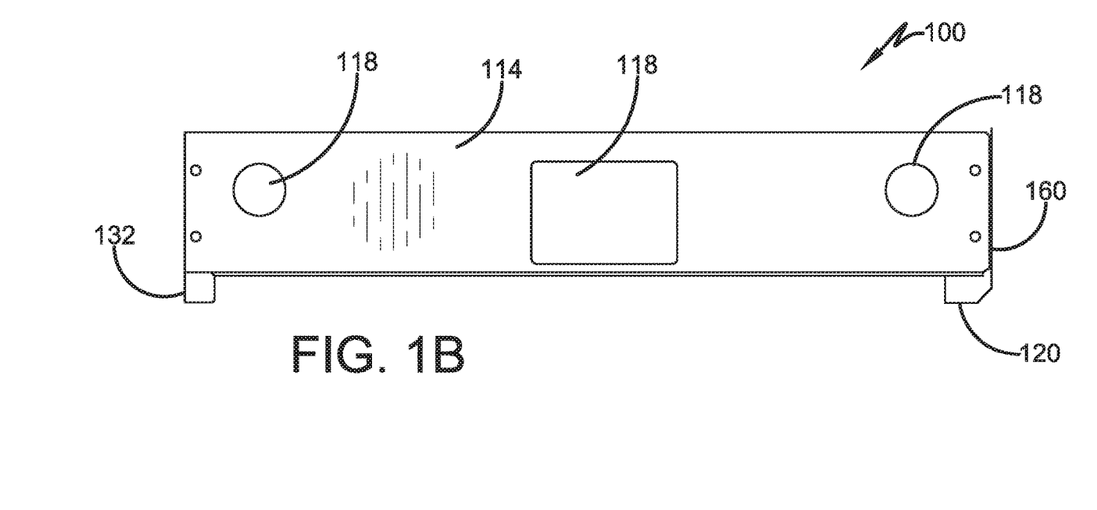
Figure 1C:
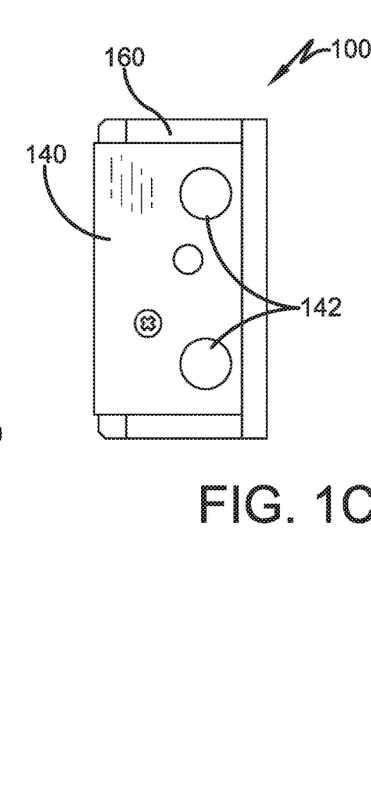

As shown in FIGS. 1A, 1B, and 1C, the reversible power supply enclosure 100 includes a base component 110 defining a body of the power supply enclosure 100. As further shown in FIG. 2, the base component 110 includes a base surface 112 having a plurality of edges. A first side surface 114 is formed along a first edge of the base surface 112. A second side surface 116 is formed along a second edge of the base surface 112. In the preferred embodiment, the base surface 112 and the first and second side surfaces 114, 116 are generally planar. Moreover, in the preferred embodiment, the base surface 112 is a generally rectangular base surface and the first and second edges are on opposite sides of the base surface 112. Also, the first and second surfaces 114, 116 are formed perpendicular to the base surface 112. In this manner, the base component 110 preferably has a generally U-shaped cross section.

Figure 2:
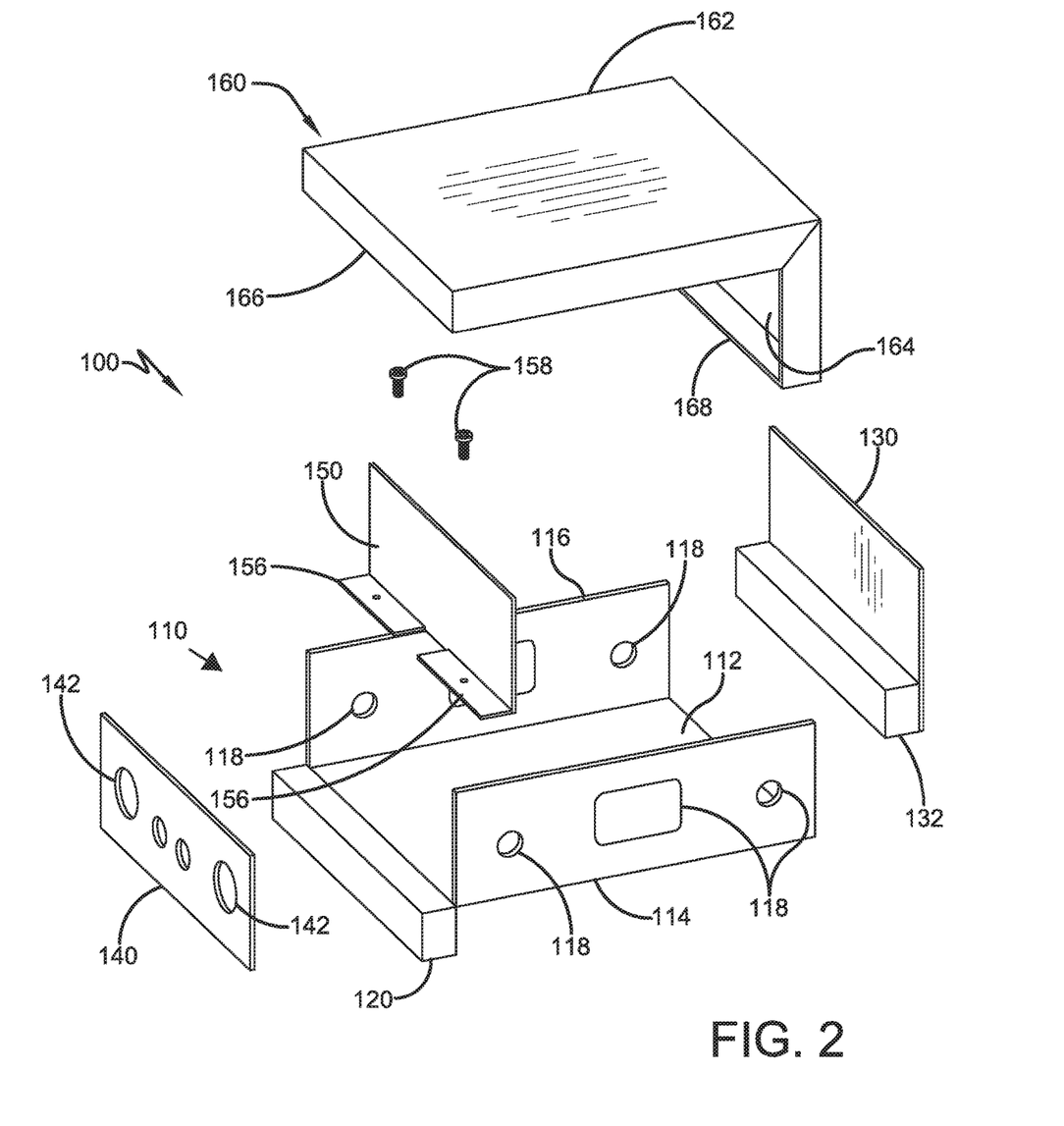
FIG. 2 is an exploded view of a power supply enclosure in accordance with an exemplary embodiment of the present invention.

As particularly evident from FIGS. 1B, 1C and 2, one or both of the first and second side surfaces 114, 116 includes one or more openings 118 for attaching conduit. These openings 118 are suitably sized to receive conventional conduits and clamps and other such devices as are known in the art. The openings 118 can be formed as a knock-out manufactured into the respective side surfaces 114, 116. Alternatively, the openings 118 can each be formed as a clean punched hole for receiving a plug. Such holes can be plugged with plastic plugs, as explained in detail hereinbelow.

Figure 5:
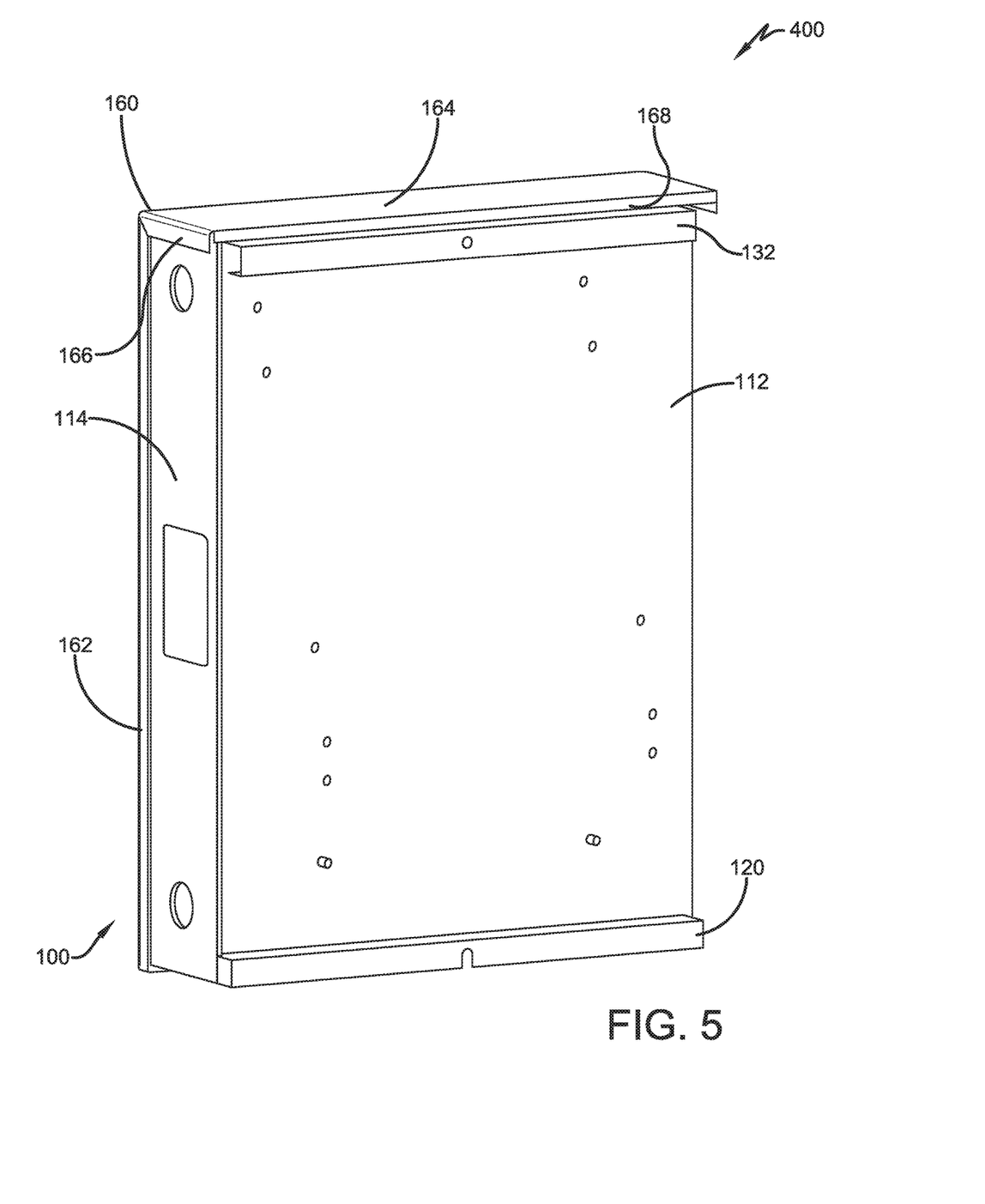
FIG. 5 is a rear perspective view of a power supply enclosure in a vertical orientation in accordance with an exemplary embodiment of the present invention.

As particularly shown in FIGS. 1B, 2, and 5, the base component 110 includes an offset flange 120 formed along a third edge of the base surface 112. The offset flange 120 is a first offset flange 120 that cooperates with a second offset flange (described in detail hereinbelow) for displacing the base component 110 a predetermined distance from a mounting surface, which can be a roof or floor upon which the power supply enclosure 100 is mounted. In the preferred embodiment, the offset flange 120 is formed to define a predetermined distance of one-half inch, thereby complying with the UL standard for wet/damp LED power supply enclosures. However, the offset flange 120 can alternatively be formed to define any desired predetermined distance without departing from the invention.

As specifically depicted in FIGS. 1A, 1C, 2, and 5, the reversible power supply enclosure also includes a closed end component 130 connected to the base component 110 along a fourth edge of the base surface. The closed end component 130 includes a second offset flange 132, formed along a bottom portion of the closed end component 130. The second offset flange 132 cooperates with the first offset flange 120 for displacing the base component the predetermined distance from the mounting surface. The closed end component 130 is secured to an open end of the U-shaped structure of the base component 110, and encloses that side of the base component 110.

As specifically depicted in FIGS. 1B, 2, and 5, in the preferred embodiment, the first and second offset flanges 120, 132 are configured on opposite edges of the rectangular base surface 112, each respectively located between the first and second edges of the rectangular base surface 112 and thereby located between the first and second side surfaces 114, 116. The first and second offset flanges 120, 132 are both are sized to define the predetermined distance of one-half inch between the base component 110 and the mounting surface. In this manner, these flanges 120, 132 cooperate to form a power supply enclosure 100 that complies with the UL wet/damp requirements.

In the preferred embodiment, the base component 110 and the closed end component 130 are individual sheet metal components. Thus, all the structures described herein are formed by conventional stamping operations, as are known and understood in the art. With continued reference to FIGS. 1B, 2, and 5, the first offset flange 120 is formed of a crimped portion of the base component 110 and the second offset flange 132 is formed of a crimped portion of the closed end component 130. Since both of these components 110, 130 are formed of sheet metal, the flanges 120, 132 are formed of sheet metal portions attached to the main bodies of the components 110, 130 and crimped into the suitable shape using the conventional stamping operations.

As shown in FIGS. 1B, 2, and 5, the flanges 120, 132 are crimped into a shape having a rectangular cross-sectional profile following longitudinally along the respective edges of the components 110, 130. The geometry of the present design provides the desired half-inch spacing of the power supply enclosure 100 away from the mounting surface.

With particular reference to FIGS. 1A, 1C and 2, a conduit cover 140 is connected to the base component 110 at a position substantially proximate to the first offset flange 120. In the preferred embodiment, the conduit cover 140 is secured via a TOX®-Round Joint system. The conduit cover 140 is secured to an open end of the U-shaped structure of the base component 110 opposite from the closed end component 130, and encloses that side of the base component 110.

With continued reference to FIGS. 1A, 1C and 2, similarly to the side surfaces 114, 116 as explained hereinabove, the conduit cover 140 includes comprises a plurality of openings 142 for attaching low voltage connections to one or more of a conduit, a ground bolt, or a switch. These openings 142 are suitably sized to receive conventional conduits and clamps and other such devices as are known in the art. In the preferred embodiment, the conduit cover 140 is also formed of sheet metal. The openings 142 can be formed as knock-outs manufactured into the sheet metal of the conduit cover 140, in accordance with known methods. Alternatively, the openings 142 can each be formed as a clean punched hole for receiving a plug. Such holes can be plugged with plastic plugs that can be included with the end product, as explained in detail hereinbelow.

With particular reference FIGS. 1A and 2, a partition 150 is provided for defining an isolated area 152 for making the high voltage connections. The isolated area 152 is separate from a main area 154 within the enclosure body used to make the incoming low voltage connections within the base component 110. In this manner, the isolated area 152 eliminates the need for a separate junction box. The partition 150 is removable, so that the isolated area 152 is thereby defined as an optional isolated area, depending on the needs of the installer at the installation site.

As also indicated in FIGS. 1A and 2, the partition 150 is connected to the base component 110 at a position interior to the conduit cover 140. In the preferred embodiment, the partition 150 is also formed of sheet metal. In the preferred embodiment, the partition 150 includes a pair of tabs 156, formed of bent portions of sheet metal perpendicular to the partition 150, and secured to the base surface 112 with a pair of screws 158. In this manner, the partition 150 can be optionally added to the power supply enclosure 100 in embodiments where isolation between high and low voltage components is required.

With particular reference to FIGS. 1B, 1C, and 2, the present power supply enclosure 100 includes a cover component 160. The cover component 160 includes a primary surface 162 for enclosing an opening in the power supply enclosure 100 defined by the first and second side surfaces 114, 116 of the base component 110 (best shown in the exploded view of FIG. 2), the closed end component 130, and the conduit cover 140. In this manner, the primary surface 162 encloses the opening in the four sides of the enclosure 100 formed by the U-shaped base component 110 with the closed end component 130 and the conduit cover 140.

With continued reference to FIGS. 1B, 1C, and 2, the cover component 160 includes a secondary surface 164, perpendicular to the primary surface 162, for enclosing the closed end component 130. In this manner, the primary and secondary surfaces 162, 164 enclose the power supply enclosure 100 in a reversible manner, as will be explained in greater detail hereinbelow. The cover component 160 includes a lip portion 166 that substantially surrounds the peripheries of the primary and secondary surfaces 162, 164. The cover component 160 also includes a partial lip 168 that extends from the open edge of secondary surface 164, about half as far as the lip portion 166 on the other sides. In the preferred embodiment, the cover component 160 is also formed of sheet metal. Thus, the lip portion 166 and the partial lip 168 are formed of tab portions of sheet metal extending outwardly from the primary and secondary surfaces 162, 164 and bent at a 90 degree angle to extend perpendicularly away from the primary and secondary surfaces 162, 164 so that the lip portion 166 thereby overlaps onto the first and second side surfaces 114, 116, thereby enclosing the edges between the cover component 160 and the power supply enclosure 100, thus preventing moisture from entering thereinto.

Figure 3:
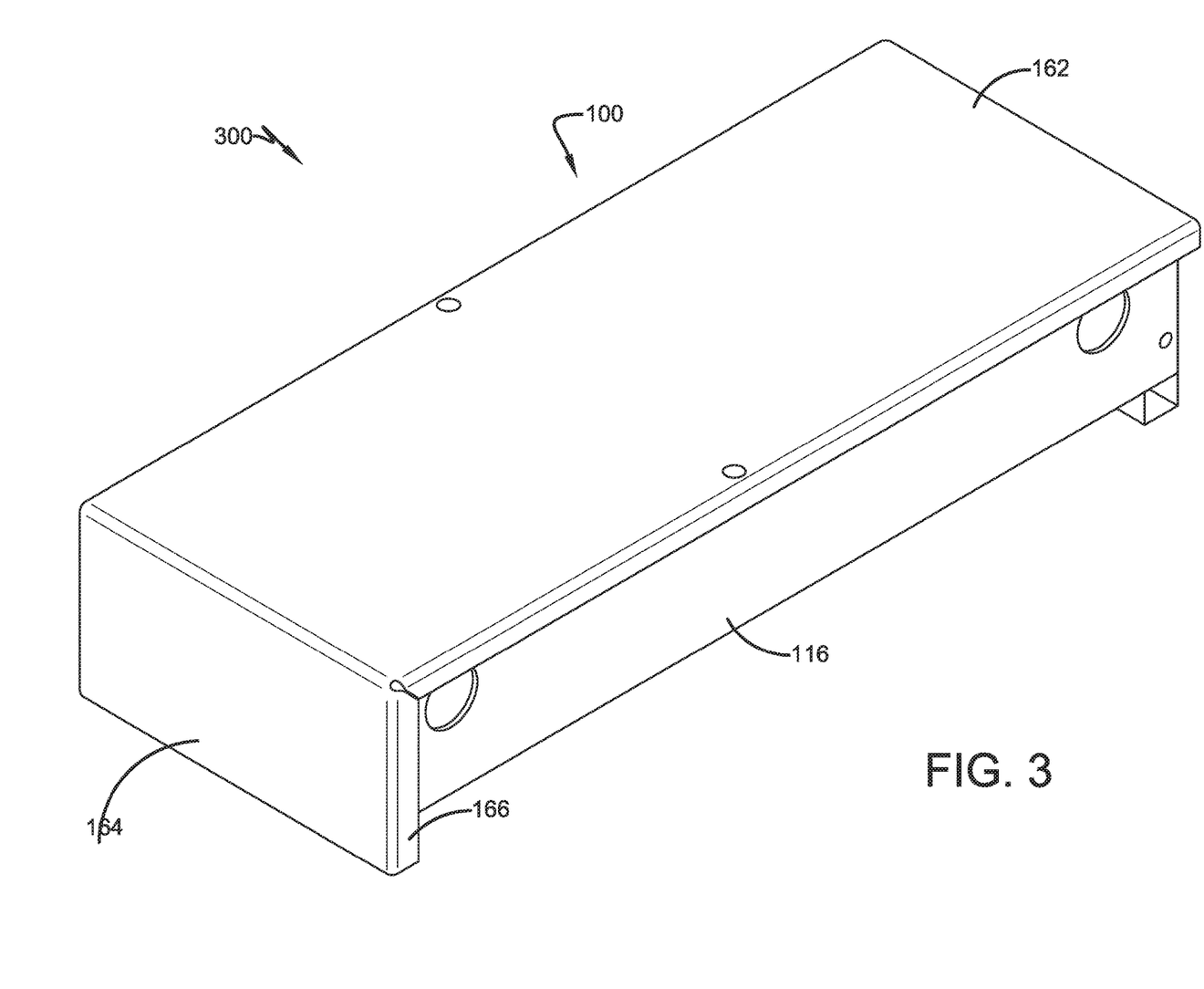
FIG. 3 is a front perspective view of a power supply enclosure in a horizontal orientation in accordance with an exemplary embodiment of the present invention.
Figure 4:
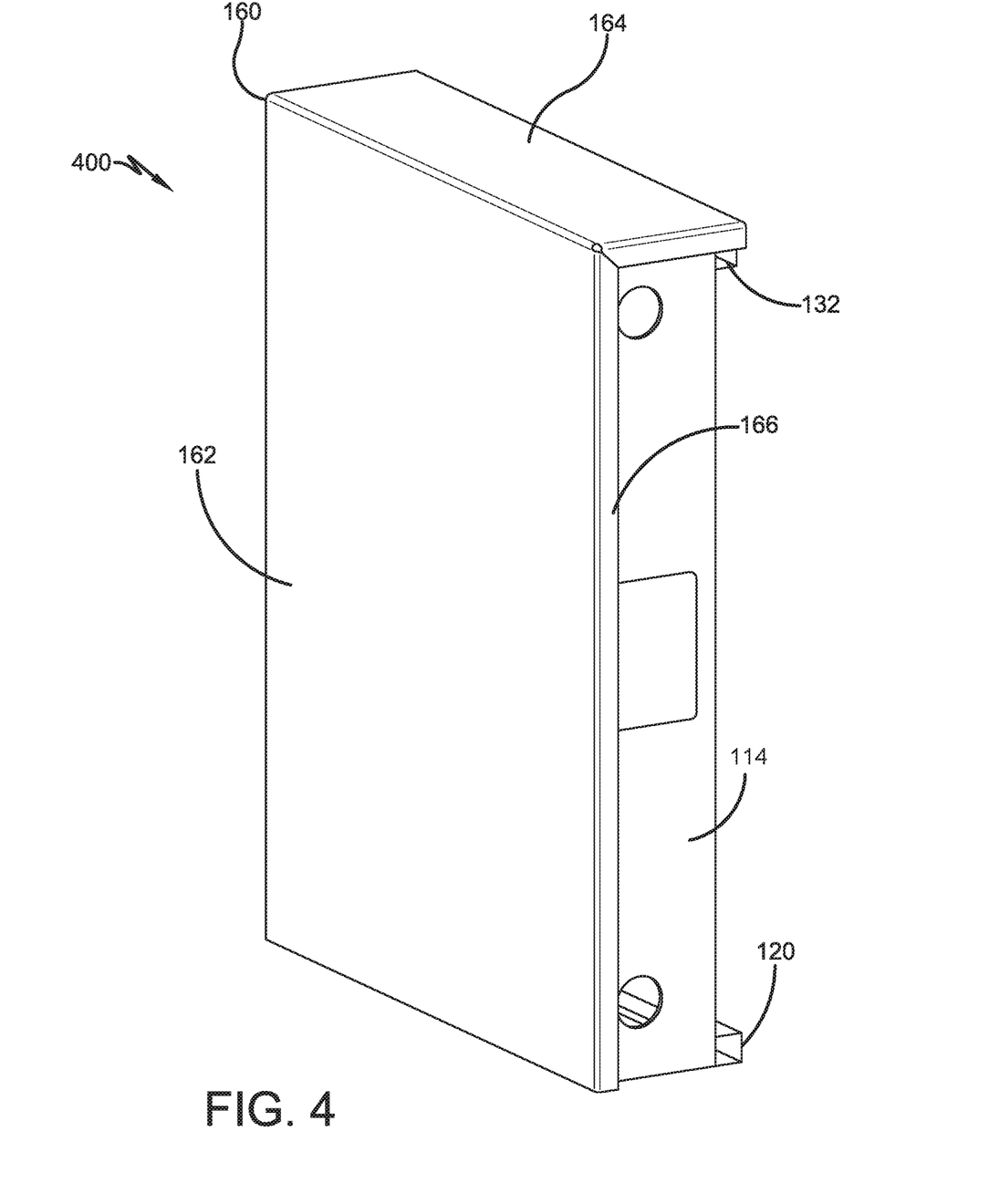
FIG. 4 is a front perspective view of a power supply enclosure in a vertical orientation in accordance with an exemplary embodiment of the present invention.

With reference to FIGS. 3, 4, and 5, the cover component 160 with the lip portion 166 encircling the peripheries of the primary and secondary surfaces 162, 164 enables the present power supply enclosure 100 to be reversibly mounted in either a horizontal orientation 300 or a vertical orientation 400 such that both orientations provide a moisture-resistant power supply enclosure.

For example, in the horizontal orientation 300 shown in FIG. 3, the lip portion 166 adjoining the primary surface 162 of the cover component 160 overlaps with the second side surface 116 of the base component 110, to cover the open top when mounted horizontally so that any moisture is prevented from entering the power supply enclosure 100 in that orientation. (Please advise whether FIG. 3 is properly rotated. If not, please provide a correct view.)

In the vertical orientation 400 shown in FIGS. 4 and 5, the lip portion 166 adjoining the secondary surface 164 of the cover component 160 overlaps with the closed end component 130, to cover the top end when mounted vertically. The openings in the vertical surfaces are shielded so water falling from above is directed to the sides without entering the power supply enclosure 100, so that any moisture is prevented from entering the power supply enclosure 100 from that side. As particularly indicated in the rear view of FIG. 5, the power supply enclosure 100 is shown from the mounting side and indicates how the surfaces are designed to shield the openings and prevent water from entering the enclosure 100. The partial lip 168 covers the top of offset flange 132 to lip prevent water from flowing between the cover component 160 and the closed end component 130 into the enclosure 100.

As explained hereinabove, the first and second side surfaces 114, 116 and the conduit cover 140 can be formed with respective openings 118, 142 that are suitably sized to receive conventional conduits and clamps and other such devices as are known in the art. The openings 118, 142 can be formed as knock-outs manufactured into the respective side surfaces 114, 116 and conduit cover 140. Alternatively, the openings 118, 142 can each be formed as a clean punched hole that can be plugged with plastic plugs. FIGS. 6A, 6B, 6C, 7A, 7B, 7C, 8A, 8B, 8C, 9A, 9B, and 9C depict various alternative embodiments that show the respective holes openings 118, 142 with conduit portions 500 received therein. It is to be appreciated that components indicated by like reference numerals shown in FIGS. 6A, 6B, 6C, 7A, 7B, 7C, 8A, 8B, 8C, 9A, 9B, and 9C correspond to like components indicated in FIGS. 1A, 1B, 1C, 2, 3, 4, and 5 as disclosed herewith.

Figures 6A, 6B, 6C:
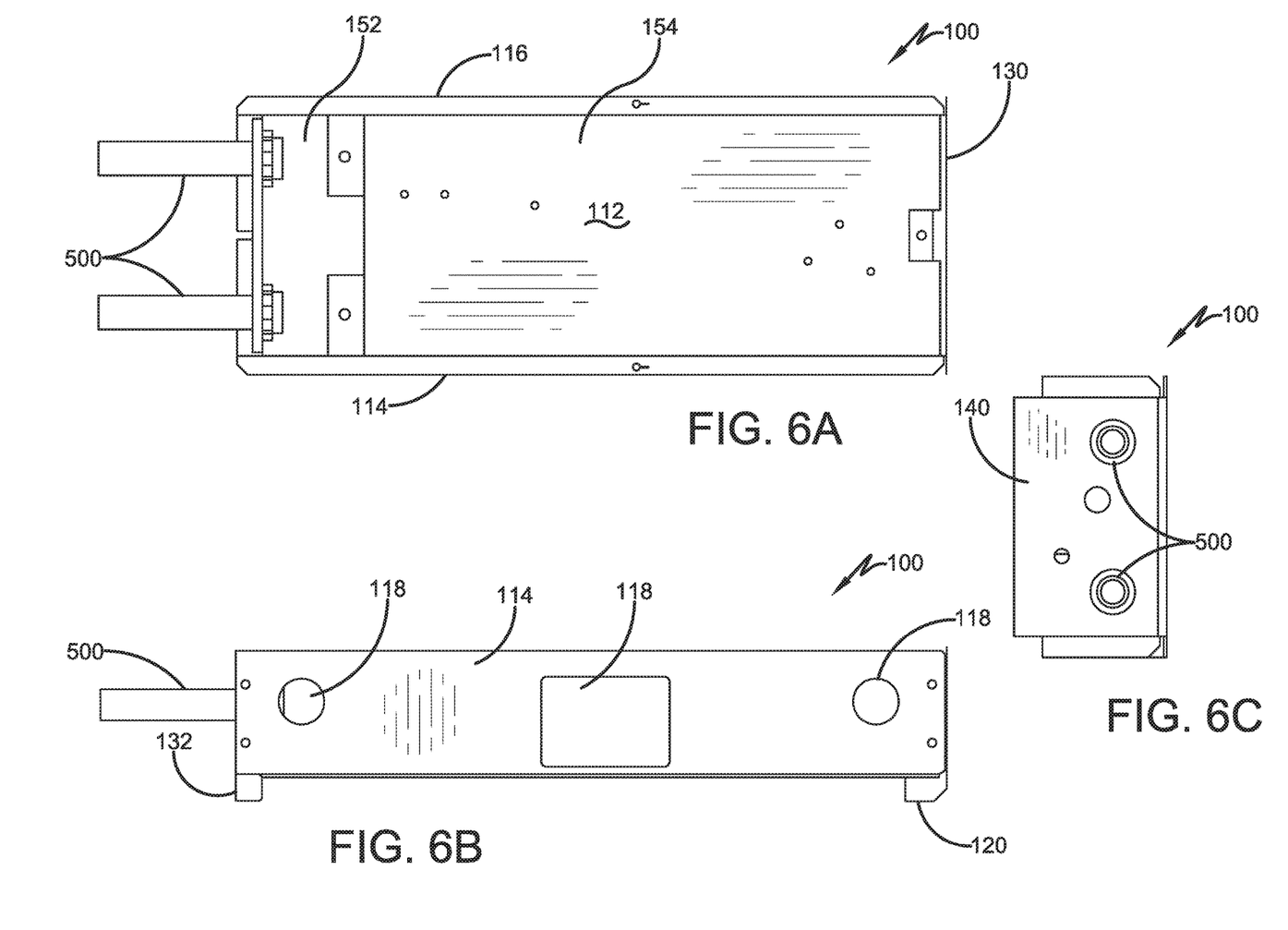
FIGS. 6A, 6B, and 6C are respective top, side, and edge views of a power supply enclosure in accordance with an alternative embodiment of the present invention.

FIGS. 6A, 6B, and 6C depict a reversible power supply enclosure 100 in accordance with the embodiment of FIGS. 1A, 1B, and 1C except insofar as conduit portions 500 are received within the openings 142 in the conduit cover 140. In this manner, the embodiment of FIGS. 6A, 6B, and 6C depicts a conduit configuration that is linear with respect to a long dimension of the enclosure 100, thereby highlighting a different wire routing option which eliminates the need for an additional junction box.

Figure 7A:
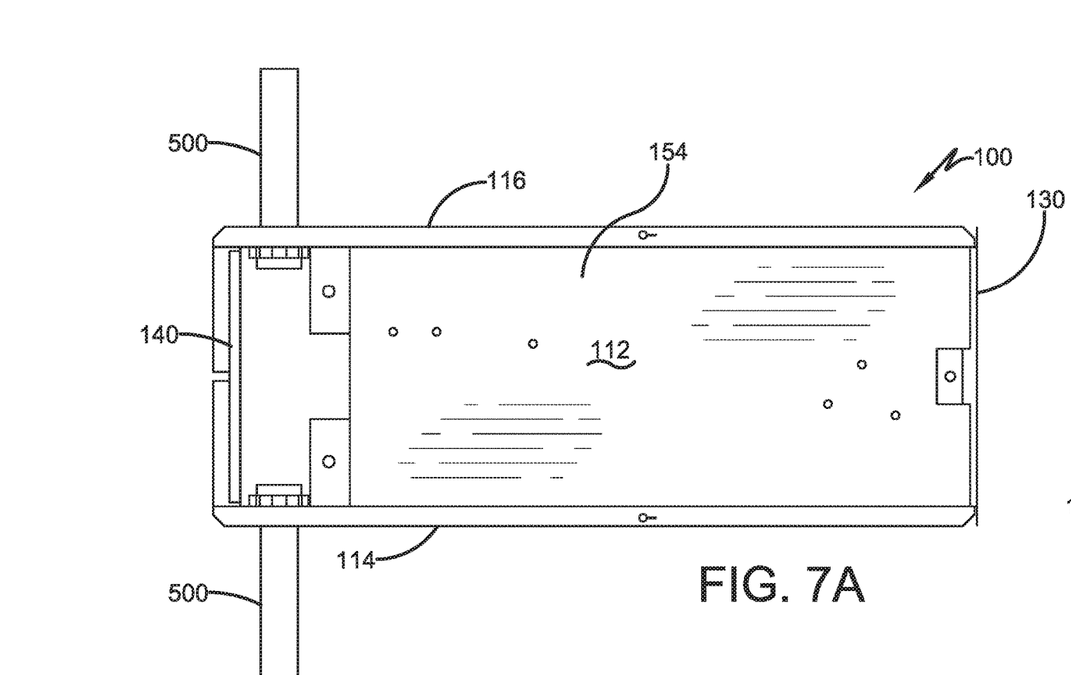
FIGS. 7A, 7B, and 7C are respective top, side, and edge views of a power supply enclosure in accordance with another alternative embodiment of the present invention.
Figure 7B:
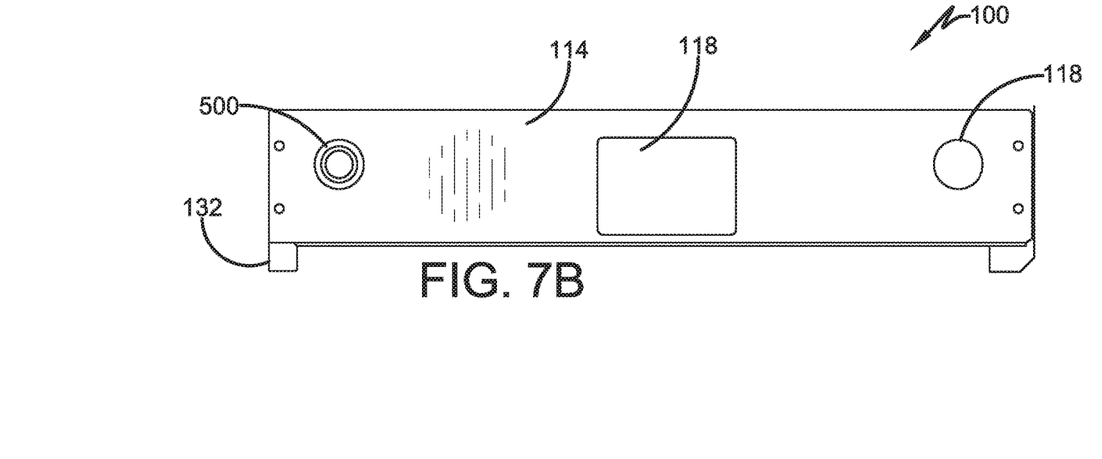
Figure 7C:
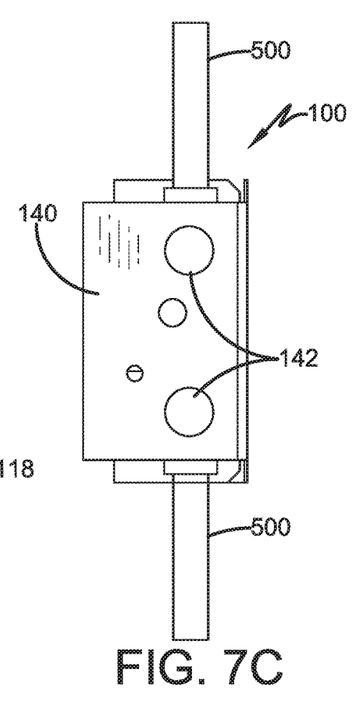

FIGS. 7A, 7B, and 7C depict a reversible power supply enclosure 100 in accordance with the embodiment of FIGS. 1A, 1B, and 1C except insofar as conduit portions 500 are received within a pair of openings 118 in the first and second side surfaces 114, 116. In this manner, the embodiment of FIGS. 6A, 6B, and 6C depicts a conduit configuration that is perpendicular to a long dimension of the enclosure 100, thereby highlighting another different wire routing option which eliminates the need for an additional junction box.

Figure 8A:
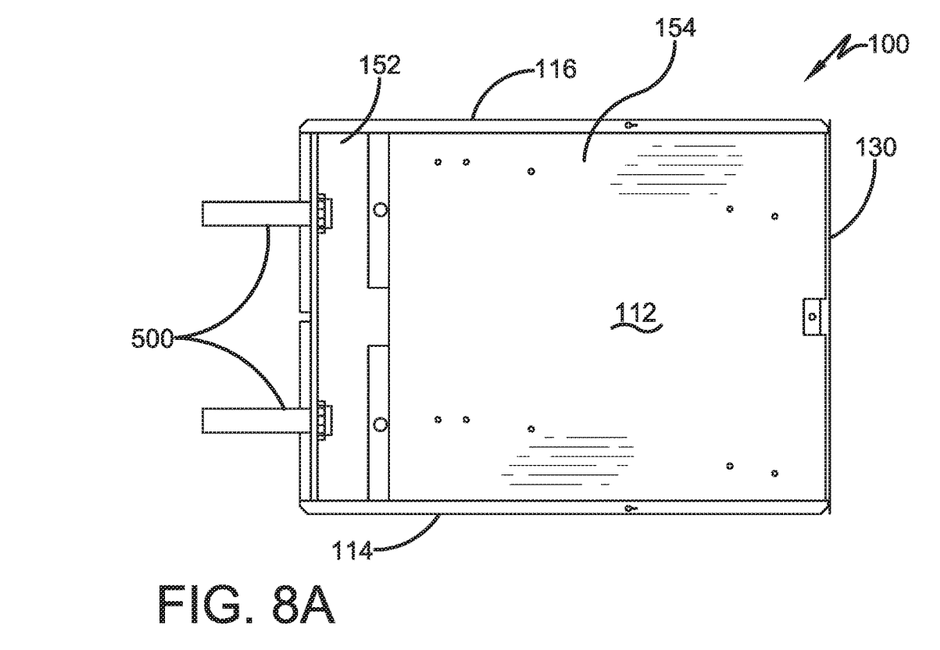
FIGS. 8A, 8B, and 8C are respective top, side, and edge views of a power supply enclosure in accordance with yet another alternative embodiment of the present invention.
Figure 8B:
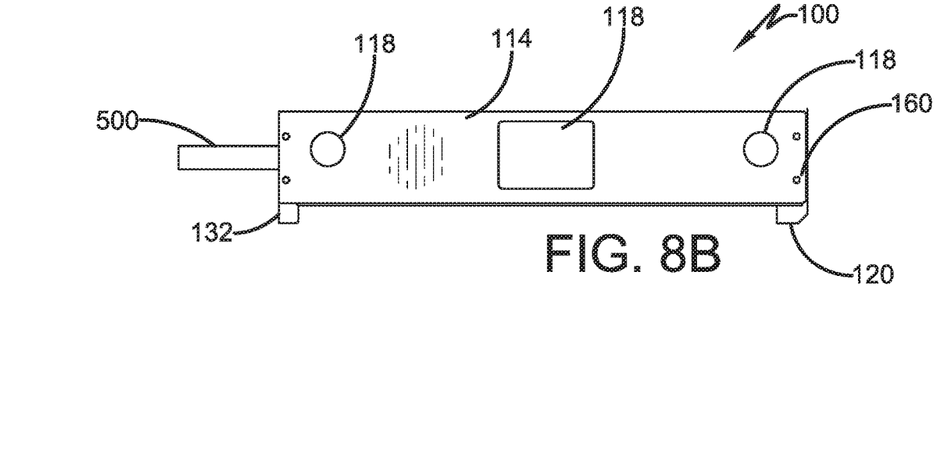
Figure 8C:
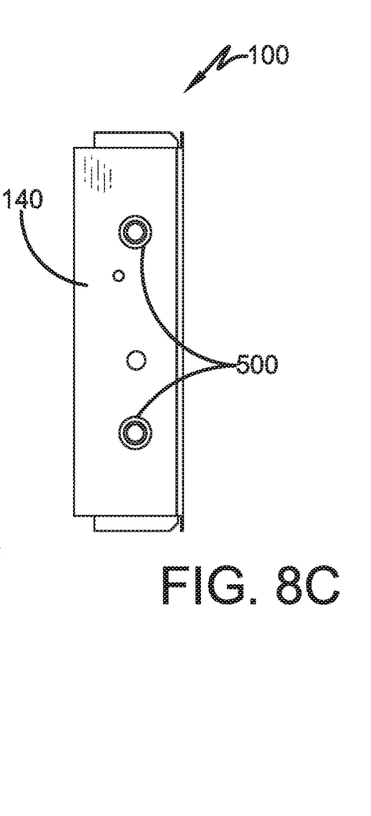

FIGS. 8A, 8B, and 8C depict a reversible power supply enclosure 100 having a larger width compared to the embodiment of FIGS. 1A, 1B, and 1C but otherwise similar to the embodiment of FIGS. 6A, 6B, and 6C in that conduit portions 500 are received within the openings 142 in the conduit cover 140. In this manner, the embodiment of FIGS. 8A, 8B, and 8C also depicts a conduit configuration that is linear with respect to a long dimension of the enclosure 100, thereby highlighting yet another different wire routing option which eliminates the need for an additional junction box.

Figure 9A:
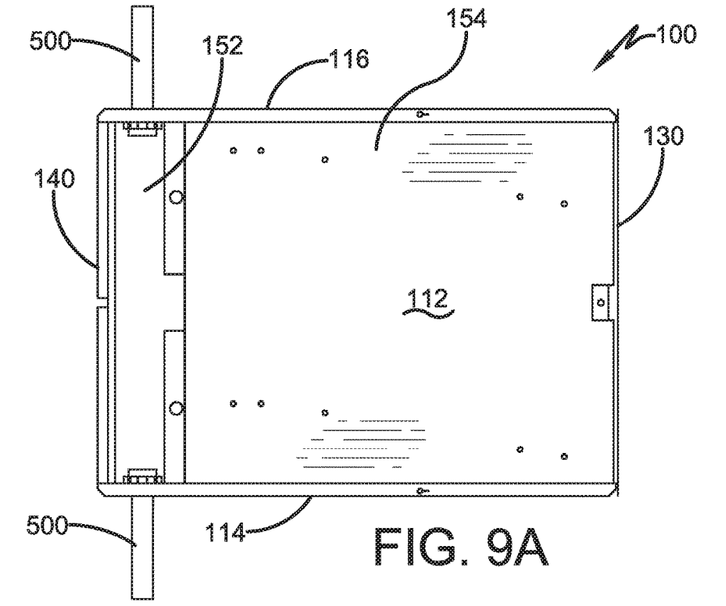
FIGS. 9A, 9B, and 9C are respective top, side, and edge views of a power supply enclosure in accordance with a further alternative embodiment of the present invention.
Figure 9B:
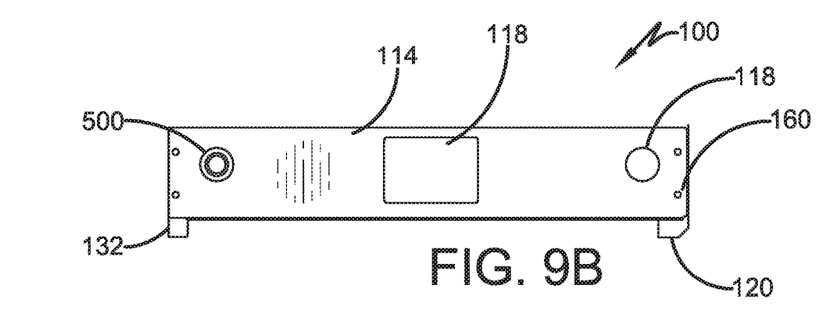
Figure 9C:
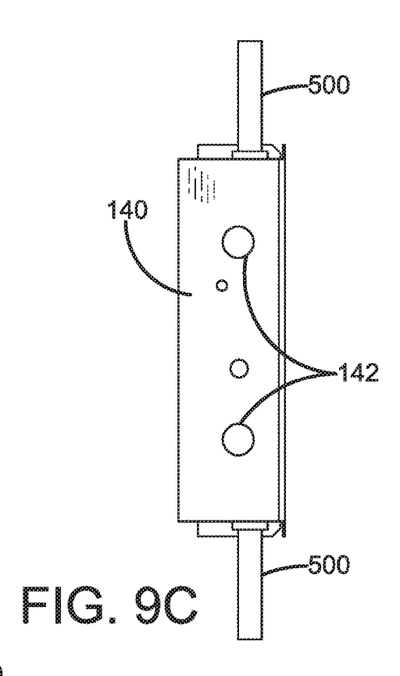

FIGS. 9A, 9B, and 9C depict a reversible power supply enclosure 100 having a larger width compared to the embodiment of FIGS. 1A, 1B, and 1C but otherwise similar to the embodiment of FIGS. 7A, 7B, and 7C in that conduit portions 500 are received within a pair of openings 118 in the first and second side surfaces 114, 116. In this manner, the embodiment of FIGS. 9A, 9B, and 9C also depicts a conduit configuration that is perpendicular to a long dimension of the enclosure 100, thereby highlighting still another different wire routing option which eliminates the need for an additional junction box.

As described hereinabove, the geometry of the present power supply enclosure design provides the one-half inch spacing off the floor in accordance with the UL requirement when mounting horizontally and shields any openings and preventing water from entering the enclosure when mounted vertically. It also provides an isolated area for the high voltage connections to be made. In this manner, the present invention provides a combined horizontal/vertical mount in a single product. The present invention results in reduced installation time and requires no fasteners below the mounting surface. In providing a removable partition, the present invention provides an optional isolated area for high voltage connections. The present design can thus be developed into a family of products varying in length and width to accommodate various sizes and quantities of power supplies, providing considerable flexibility and savings to the end user.

Numerous embodiments have been described herein. It will be apparent to those skilled in the art that the above methods and apparatuses may incorporate changes and modifications without departing from the general scope of this invention. It is intended to include all such modifications and alterations in so far as they come within the scope of the appended claims or the equivalents thereof.

Having thus described the invention, it is now claimed:

What is claimed:

1. A reversible power supply enclosure comprising:
    a base component defining a body of the power supply enclosure, wherein the base component includes:
        a base surface having a plurality of edges; and
        a first side surface formed along a first edge of the base surface;
        a second side surface formed along a second edge of the base surface;
        a first offset flange formed along a third edge of the base surface for displacing the base component a predetermined distance from a mounting surface;
    wherein the reversible power supply enclosure further comprises:
        a closed end component connected to the base component along a fourth edge of the base surface, wherein the closed end component further comprises a second offset flange for displacing the base component the predetermined distance from the mounting surface; and
        a cover component comprising:
            a primary surface for enclosing an opening between the first and second side surfaces and the closed end component;
            a secondary surface, perpendicular to the primary surface, for enclosing the closed end component; and
            a lip portion substantially surrounding peripheries of the primary and secondary surfaces, thereby enabling the power supply enclosure to be reversibly mounted in either a vertical orientation or a horizontal orientation such that both orientations provide a moisture-resistant power supply enclosure.

2. The reversible power supply enclosure of claim 1, wherein base surface and the first and second side surfaces are generally planar.

3. The reversible power supply enclosure of claim 1, wherein the base surface is a generally rectangular base surface and the first and second edges are on opposite sides, wherein the first and second surfaces are formed perpendicular to the base surface, such that the base component has a generally U-shaped cross section.

4. The reversible power supply enclosure of claim 3, wherein the first and second offset flanges are configured on opposite edges of the rectangular base surface, each respectively located between the first and second edges of the rectangular base surface.

5. The reversible power supply enclosure of claim 3, wherein the first offset flange is formed of a crimped portion of the base component, and wherein the second offset flange is formed of a crimped portion of the closed end component.

6. The reversible power supply enclosure of claim 3, wherein the first and second offset flanges are sized to define a predetermined distance of one-half inch between the base component and the mounting surface.

7. The reversible power supply enclosure of claim 1, further comprising a conduit cover connected to the base component substantially proximate to the first offset flange, wherein the conduit cover comprises a plurality of openings for attaching high voltage connections to at least one of a conduit, a ground bolt, or a switch.

8. The reversible power supply enclosure of claim 7, further comprising a partition, connected to the base component at a position interior to the conduit cover, for defining an isolated area for making the high voltage connections, separate from a main area used to make the incoming low voltage connections within the base component.

9. The reversible power supply enclosure of claim 8, wherein the partition is removable, thereby defining an optional isolated area.

10. The reversible power supply enclosure of claim 1, wherein at least one of the first and second side surfaces comprises at least one opening for attaching conduit.

11. The reversible power supply enclosure of claim 10, wherein the at least one opening comprises at least one of a knock-out manufactured into the respective side surfaces or a clean punched hole for receiving a plug.

12. A reversible power supply enclosure comprising:
    a base component defining a body of the power supply enclosure, wherein the base component includes:
        a base surface having a plurality of edges; and
        a first side surface formed along a first edge of the base surface;
        a second side surface formed along a second edge of the base surface;
        a first offset flange formed along a third edge of the base surface for displacing the base component a predetermined distance from a mounting surface;
    wherein the reversible power supply enclosure further comprises:
        a closed end component connected to the base component along a fourth edge of the base surface, wherein the closed end component further comprises a second offset flange for displacing the base component the predetermined distance from the mounting surface;

a conduit cover connected to the base component substantially proximate to the first offset flange; wherein the conduit cover comprises a plurality of openings for attaching at least one of a conduit, a ground bolt, or a switch;

a partition, connected to the base component at a position interior to the conduit cover, for defining an isolated area for high voltage wiring within the base component; and a cover component comprising:
 a primary surface for enclosing an opening between the first and second side surfaces, the closed end component, and the conduit cover;
 a secondary surface; perpendicular to the primary surface; for enclosing the closed end component; and
 a lip portion substantially surrounding peripheries of the primary and secondary surfaces, thereby enabling the power supply enclosure to be reversibly mounted in either a vertical orientation or a horizontal orientation such that both orientations provide a moisture-resistant power supply enclosure.

* * * * *